United States Patent
Acharya et al.

(10) Patent No.: US 6,563,439 B1
(45) Date of Patent: May 13, 2003

(54) METHOD OF PERFORMING HUFFMAN DECODING

(75) Inventors: Tinku Acharya, Chandler, AZ (US); Ping-Sing Tsai, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/704,380

(22) Filed: Oct. 31, 2000

(51) Int. Cl.$^7$ ................................................ H03M 7/40
(52) U.S. Cl. .......................................... 341/65; 341/67
(58) Field of Search ..................... 341/65, 67

(56) References Cited

U.S. PATENT DOCUMENTS

| | | | | |
|---|---|---|---|---|
| 4,813,056 A | | 3/1989 | Fedele | |
| 4,899,149 A | * | 2/1990 | Kahan | 341/67 |
| 5,467,088 A | * | 11/1995 | Kinouchi et al. | 341/65 |
| 5,973,627 A | * | 10/1999 | Bakhmutsky | 341/67 |
| 6,040,790 A | * | 3/2000 | Law | 341/65 |
| 6,075,470 A | | 6/2000 | Little et al. | |

FOREIGN PATENT DOCUMENTS

EP 0907288 A2 4/1999

OTHER PUBLICATIONS

Mukherjee, et al., "Marvle: A VLSI Chip for Data Compression Using Tree–Based Codes", 8432 IEEE Transactions on very large scale integration (VLSI) systems, Jun. 1, 1993, No. 2, New York, US, XP 000390613, 6 Pgs.

Hirschberg, et al., "Efficient Decoding of Prefix Codes", 8070 Communications of the ACM 33 (1990) Apr. No. 4, New York, US, XP 000116512, 5 Pgs.

Chang, et al., "VLSI Designs for High–Speed Huffman Decoder", Department of Electrical Engineering and Computer Science, University of California, Berkeley, CA, 1991 IEEE, pp. 500–503.

Cho, et al., "Design of Low Power Variable Length Decoder Using Fine Non–Uniform Table Partitioning", Department of EECS, Massachusetts Institute of Technology, Cambridge, MA, 1997 IEEE, pp. 2156–2159.

Ooi, et al., "A 162Mbit/s Variable Length Decoding Circuit Using an Adaptive Tree Search Technique", IEEE 1994 Custom Integrated circuits conference, XP 000492866, 2 Pgs.

* cited by examiner

*Primary Examiner*—Howard L. Williams
(74) *Attorney, Agent, or Firm*—Howard A. Skaist

(57) ABSTRACT

Embodiments of a method of performing Huffman decoding are disclosed. In one such embodiment, a data structure is employed, although, of course, the invention is not limited in scope to the particular embodiments disclosed.

10 Claims, 4 Drawing Sheets

| Index | Symbol | Length (bits) | Huffman code |
|---|---|---|---|
| - | S1 | 0 | - |
| - | S2 | 0 | - |
| - | S3 | 0 | - |
| 0 | S8 | 3 | 000 |
| 1 | S11 | 3 | 001 |
| 2 | S12 | 3 | 010 |
| 3 | S4 | 4 | 0110 |
| 4 | S5 | 4 | 0111 |
| 5 | S6 | 4 | 1000 |
| 6 | S7 | 4 | 1001 |
| 7 | S9 | 4 | 1010 |
| 8 | S10 | 4 | 1011 |
| 9 | S14 | 4 | 1100 |
| 10 | S16 | 4 | 1101 |
| 11 | S0 | 5 | 11100 |
| 12 | S13 | 5 | 11101 |
| 13 | S17 | 5 | 11110 |
| 14 | S15 | 6 | 111110 |
| 15 | S18 | 6 | 111111 |

| Length (number of bits) | Start_Code (decimal value) | End_Code (decimal value) | Base_Index |
|---|---|---|---|
| 3 | 000 (0) | 010 (2) | 0 |
| 4 | 0110 (6) | 1101 (14) | 3 |
| 5 | 11100 (28) | 11110 (31) | 11 |
| 6 | 111110 (62) | 111111 (63) | 14 |

| Symbol | Huffman Code I | Huffman Code II | Huffman Code III | Huffman Code IV |
|---|---|---|---|---|
| S0 | 0 | 0 | 1 | 1 |
| S1 | 10 | 11 | 01 | 00 |
| S2 | 11 | 10 | 00 | 01 |

| Symbol | Length (bits) | Huffman code |
|---|---|---|
| S0 | 5 | 11100 |
| S1 | 0 | - |
| S2 | 0 | - |
| S3 | 0 | - |
| S4 | 4 | 0110 |
| S5 | 4 | 0111 |
| S6 | 4 | 1000 |
| S7 | 4 | 1001 |
| S8 | 3 | 000 |
| S9 | 4 | 1010 |
| S10 | 4 | 1011 |
| S11 | 3 | 001 |
| S12 | 3 | 010 |
| S13 | 5 | 11101 |
| S14 | 4 | 1100 |
| S15 | 6 | 111110 |
| S16 | 4 | 1101 |
| S17 | 5 | 11110 |
| S18 | 6 | 111111 |

Figure 3

| Symbol | Codeword |
|---|---|
| a | 00 |
| b | 01 |
| c | 100 |
| d | 101 |
| e | 110 |
| f | 1110 |
| g | 11110 |
| h | 11111 |

Encoding Table                    Decoding Tree

| Memory Address | | Output | |
|---|---|---|---|
| Node | Input | Next-Node/ [Codeword] | Termination Flag |
| 0 | 0 | 5 | 0 |
| 0 | 1 | 1 | 0 |
| 1 | 0 | 6 | 0 |
| 1 | 1 | 2 | 0 |
| 2 | 0 | [e] | 1 |
| 2 | 1 | 3 | 0 |
| 3 | 0 | [f] | 1 |
| 3 | 1 | 4 | 0 |
| 4 | 0 | [g] | 1 |
| 4 | 1 | [h] | 1 |
| 5 | 0 | [a] | 1 |
| 5 | 1 | [b] | 1 |
| 6 | 0 | [c] | 1 |
| 6 | 1 | [d] | 1 |

| Index | Symbol | Length (bits) | Huffman code |
|---|---|---|---|
| - | S1 | 0 | - |
| - | S2 | 0 | - |
| - | S3 | 0 | - |
| 0 | S8 | 3 | 000 |
| 1 | S11 | 3 | 001 |
| 2 | S12 | 3 | 010 |
| 3 | S4 | 4 | 0110 |
| 4 | S5 | 4 | 0111 |
| 5 | S6 | 4 | 1000 |
| 6 | S7 | 4 | 1001 |
| 7 | S9 | 4 | 1010 |
| 8 | S10 | 4 | 1011 |
| 9 | S14 | 4 | 1100 |
| 10 | S16 | 4 | 1101 |
| 11 | S0 | 5 | 11100 |
| 12 | S13 | 5 | 11101 |
| 13 | S17 | 5 | 11110 |
| 14 | S15 | 6 | 111110 |
| 15 | S18 | 6 | 111111 |

Figure 6

| Length (number of bits) | Start_Code (decimal value) | End_Code (decimal value) | Base_Index |
|---|---|---|---|
| 3 | 000 (0) | 010 (2) | 0 |
| 4 | 0110 (6) | 1101 (14) | 3 |
| 5 | 11100 (28) | 11110 (31) | 11 |
| 6 | 111110 (62) | 111111 (63) | 14 |

Figure 7

METHOD OF PERFORMING HUFFMAN DECODING

RELATED APPLICATION

This patent application is related to concurrently filed U.S. patent application Ser. No. 90/704,392, titled "A Method of Generating Huffman Code Length Information" by Acharya, et al., assigned to the assignee of the present invention and herein incorporated by reference.

BACKGROUND

The present invention is related to Huffman decoding.

As is well-known, Huffman coding is a popular variable length statistical encoding scheme. As is also well-known, Huffman code generation relies on statistical probabilities for each individual symbol. See, for example, D. A. Huffman, "A Method for the Reconstruction of Minimum-Redundancy Codes" Proceedings of the IRE, Volume 40, No. 9, pages 1098–1101, 1952. A traditional table lookup based encoding scheme is widely used for Huffman encoding due, at least in part, to its efficiency and relative ease of implementation. However, table searching based decoding is typically inefficient in both software and hardware implementations. This is especially the case when the number of entries in a table is reasonably high, as is typical for practical applications. Another approach employed for Huffman decoding is the creation of a Huffman tree which employs a "tree traversing technique." However, this decoding technique also has disadvantages. This particular technique is bit sequential, and introduces extra "overhead" both in terms of memory allocation and the execution of computations for the Huffman tree generation process and for the decoding process.

BRIEF DESCRIPTION OF THE DRAWINGS

The subject matter regarded as the invention is particularly pointed out and distinctly claimed in the concluding portion of this specification. The invention, however, both as to organization and method of operation, together with objects, features, and advantages thereof, may best be understood by reference to the following detailed description when read with the accompanying drawings in which:

FIG. 3 is a table illustrating an example of Huffman codes in which selected rules have been applied to uniquely determine the Huffman code;

FIG. 6 is a table using the information from the table of FIG. 3 where a different organization has been applied; and FIG. 7 is a table illustrating an embodiment of a data structure in accordance with the present invention.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously indicated, generation of Huffman codes for a set of symbols is based on the probability of occurrence of the source symbols. Typically, the construction of a binary tree referred to in this context as a Huffman tree is employed. D. A. Huffman, in the aforementioned paper, describes the process this way:

List all possible symbols with their probabilities;
Find the two symbols with the smallest probabilities;
Replace these by a single set containing both symbols, whose probability is the sum of the individual probabilities;
Repeat until the list contains only one member.

This procedure produces a recursively structured set of sets, each of which contains exactly two members. It, therefore, may be represented as a binary tree ("Huffman Tree") with the symbols as the "leaves." Then to form the code ("Huffman Code") for any particular symbol: traverse the binary tree from the root to that symbol, recording "0" for a left branch and "1" for a right branch. One issue, however, for this procedure is that the resultant Huffman tree is not unique. One example of an application of such codes is text compression, such as GZIP. GZIP is a text compression utility, developed under the GNU (Gnu's Not Unix) project, a project with a goal of developing a "free" or freely available UNIX-like operation system, for replacing the "compress" text compression utility on a UNIX operation system. See, for example, Gailly, J. L. and Adler, M., GZIP documentation and sources, available as gzip-1.2.4.tar at the website "http://www.gzip.orh/".

As is well-known, the resulting Huffman codes are prefix codes and the more frequently appearing symbols are assigned a smaller number of bits to form the variable length Huffman code. As a result, the average code length is ultimately reduced from taking advantage of the frequency of occurrence of the symbols.

Figures 1, 2:
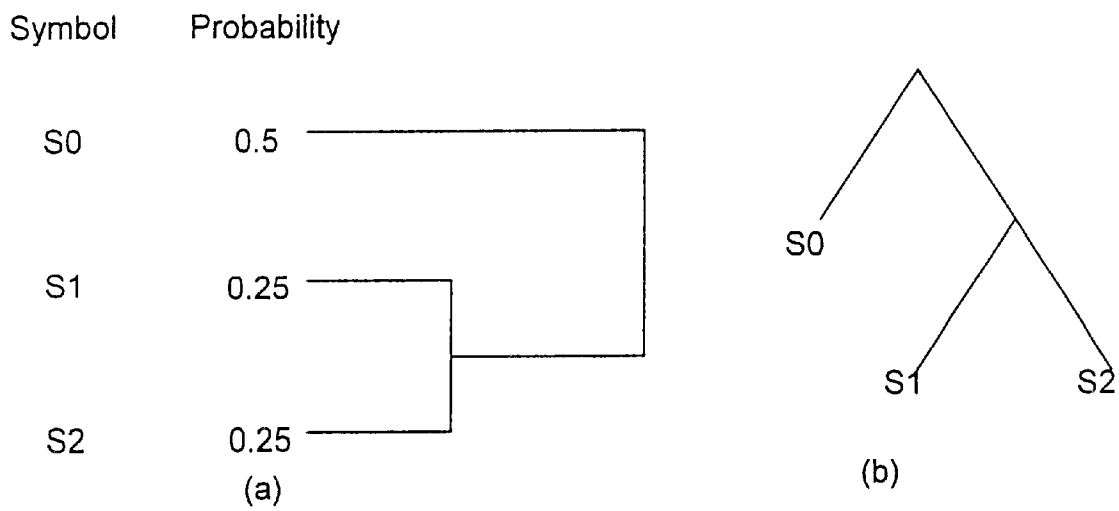
FIG. 1 is an example of Huffman tree construction and the associated Huffman tree.
FIG. 2 is a table illustrating the possible Huffman codes for the Huffman tree of FIG. 1.

FIG. 1 illustrates a simple example of a Huffman tree with three source symbols. The same Huffman tree may be represented using several binary codes by assigning different binary symbols to the edges of the tree.

The possible set of Huffman codes for this Huffman tree is illustrated in FIG. 2. From FIG. 2, it is demonstrated that Huffman codes are not unique although, it appears from this example, that the individual code length of each symbol is unique.

One may generate the length information for the Huffman codes by constructing the corresponding Huffman tree. However, as previously indicated, Huffman codes may not be unique when generated in this fashion. Nonetheless, it may be shown that by imposing two restrictions, the Huffman code produced by employing the Huffman tree may be assured of being unique. These restrictions are:

1. All codes of a given bit length have lexicographically consecutive values, in the same order as the symbols they represent; and 2. Shorter codes lexicographically precede longer codes.

Based on these restrictions, a Huffman code may be uniquely determined. FIG. 3, for example, shows a Huffman code set of 19 symbols employing these restrictions, where the code lengths are predetermined using the Huffman tree. For the table of FIG. 3, a dash in an entry in the Huffman code table shows that the code by the symbol and the current source alphabet does not exist and its length information is zero.

Although the invention is not limited in scope in this respect, the foregoing restrictions have been employed in various compression approaches and standards, such as in the previously described utility, GZIP, for example. Typically, in such applications, the Huffman tree information is passed in terms of a set of code length information along with compressed text data. Therefore, the set of code length information is sufficient to reconstruct a unique Huffman tree. The Huffman code table illustrated in FIG. 3 for example, may be generated using the following process, as implemented in GZIP.

The code lengths are initially in Length[1];
1) Count the number of codes for each code length. Let "count[N]" be the number of codes of length N, N>=1.
2) Find the numerical value of the smallest code for each code length:
Huffman_code=0; count[0]=0;
for (i=1 to MAX_BITS){
   Huffman_code=(Huffman_code+count[i-1])<<1;
   next_code[i]=Huffman_code;
}
3) Assign numerical values to all codes, using consecutive values determined in 2.

As previously indicated, Huffman encoding may be accomplished relatively easily using a table lookup technique. However, the decoding of Huffman codes is typically more computationally intensive because when code words are received in a compressed bit stream to be decoded, there are no predefined boundaries between the code words. Huffman codes are variable length codes, as previously described.

One approach or technique, referred to as a constant input rate decoder, processes the input bit stream serially, one bit at a time. This method employs the construction of a decoding or Huffman tree. Therefore, starting from the root, the technique involves traversing the branches of the decoding tree until a terminal node is reached. At the terminal node, the code word is fully decoded and the corresponding symbol may, therefore, be produced or output as desired. This process then begins again from the root of the tree. See, for example, "Image and Video Compressions Standards: Algorithms and Architectures", by B. Bhaskarin and K. Konstantinides, Kluwer Academic Publishers, 1995.

Figures 4, 5:
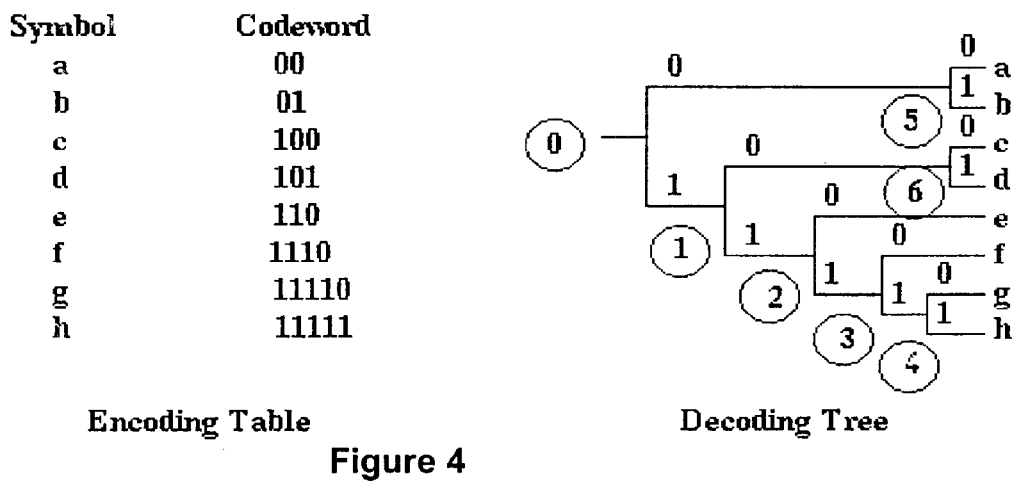
FIG. 4 is an example of a Huffman encoding table with the corresponding decoding tree.
FIG. 5 is a table illustrating read only memory (ROM) entries for bit serial Huffman decoding.

FIG. 4 is an example of a Huffman encoding table with the corresponding decoding tree. One problem associated with such a decoder in hardware or software is how to efficiently map the decoding tree into memory. For example, FIG. 5 illustrates a table of read only memory (ROM) entries for bit serial Huffman decoding using the decoding tree of FIG. 4. One approach to efficiently mapping memory was proposed for example, by Mukherjee et al., "MARVLE: a VLSI chip for data compression using tree-based codes," IEEE Transactions on Very Large Scale Integration (VLSI) System, 1(2):203–214, June 1993.

Another approach, although not particularly efficient, for decoding the Huffman code, is to compare each entry of the Huffman table with input bits in the input buffer. Under this approach, at worst, N entries in the encoding table will be compared, where N is the total number of symbols. In addition, the code length information for the entry is to be known.

In an embodiment of a method of decoding a series of binary digital signals using a data structure, the following approach may be employed. The data structure may be searched based on, at least in part, the length of a subgrouping of binary digital signals being decoded. In this particular embodiment, the series binary digital signals are encoded, such as Huffman encoded, although the invention is not restricted in scope to Huffman coding or decoding. In this particular embodiment, although the invention is not restricted in scope in this respect, prior to searching, the first N binary digital signals in the series are selected as a subgrouping, where N is the length of the shortest code. Furthermore, the length of the subgrouping is increased by the next binary digital signal in the series if no code in the data structure having length N matches the subgrouping. Likewise, in this particular embodiment, where this approach is employed, every code in the data structure having the same length as the subgrouping is checked for a match. It is noted, as shall be described in more detail hereinafter, the data structure is organized, at least in part, based on code length. Furthermore, the data structure is organized so the codes having the same code length are stored sequentially.

Although the invention is not restricted in scope to this particular embodiment of a data structure, this particular embodiment may be related to the Huffman code table of FIG. 3, after rearranging some symbols to show redundancy in a table. This is illustrated, for example, in FIG. 6. For example, the symbols with Huffman code length zero means these symbols are not employed. Likewise, based on the first of the previous restrictions, all codes of a given bit length will have lexicographically consecutive values. Thus, by tracking the length information, the Huffman code of the first symbol in lexicographical order having a Huffman code of this length, and the number of Huffman codes to the last symbol with the same length, provides the information shown with less to potentially no information redundancy.

This particular embodiment of a data structure is shown in FIG. 7. It may be noted that FIG. 7 carries the same information as FIG. 6, but is rearranged for simplicity and ease of use. Thus, FIG. 7 employs less memory and, as shall be described in more detail hereinafter, allows a bit parallel decoding scheme to be applied.

With the embodiment of a data structure illustrated in FIG. 7, decoding of the Huffman codes may be performed in a bit parallel approach based, at least in part, on the information of code length and the range of Huffman codes for each code length, as shown in the embodiment of FIG. 7. This is illustrated and described below using a pseudo-code implementation, although, again, the invention is not limited in scope to the particular pseudo-code provided.

The composite data structure is referred to in this context as NDS (NDC). This corresponds with the definition of a composite data structure for programming language C, although the invention is not limited in scope to this programming language or to any particular programming language. In this particular embodiment, although, again, the invention is not limited in scope in this respect, each entry of NDS comprises four fields, designated length, start code, end code and base index, respectively, as shown in FIG. 7, in this particular embodiment. It is, of course, appreciated that many equivalent data structures are possible, such as, instead of a start code and end code, employing a start code and the difference between the start code and end code.

In this particular embodiment, however, NDC is the number of entries with a distinct code length. Each entry represents a group of consecutive Huffman codes with the same code length. Start code is the first Huffman code of this group and end code is the last Huffman code of this group. Base index is the index value of the first Huffman code in the Huffman table for the corresponding symbol, as shown in FIG. 6. As has previously been indicated, it is noted that the invention is not restricted in scope to this particular data structure. Clearly, many modifications to this particular data structure may be made and still remain within the spirit and scope of what has been described.

Employing the embodiment of a data structure illustrated in FIG. 7, the following is a pseudo code representation of an embodiment in accordance with the present invention for decoding a series of binary digital signals.

```
Begin
  do{
    Len=0;
    for(l=0; l<NDC; l++){
      Len=NDS[l].Length;
      tmp_code=Len bits from the input buffer; /* bit-
        parallel search */
      if(NDS[l].Start_Code<=tmp_code<=NDS[l].End_
        Code){
        /*checking range*/
        tmp_offset=tmp_code-NDS[l].Start_Code;
        get the Symbol at the index location
          (NDS[l].Base_Index+tmp_offset);
        break;
      }
    }
    if(Len>0){/* symbol found */
      output Symbol;
      move the current pointer position in the input buffer
        forward Len bits;
    }
    else Error; /* no symbol found */
  } while (not last symbol);
End.
```

In this particular embodiment, although the invention is not limited in scope in this respect, prior to searching the data structure, the first N binary digital signals in a series are selected as a subgrouping, where N is the length of the shortest code. All the codes having that length are then checked for a match. If no match occurs, then the length of the subgrouping is increased by the next binary digital signal in the series and then the codes having the increased length are checked for a match. This process is continued until a match occurs. As previously noted, the data structure is organized, at least in part, based on code length and the data structure is organized so that codes having the same code length are stored lexicographically sequential. This allows for efficient operation, as desired.

It is noted that in an alternative embodiment may be possible to begin searching with the longest code and decrease the length of the subgrouping when no match occurs. However, typically, a shorter Huffman code has a higher probability of occurrence, making it is more efficient in such situations to start searching form the shortest code.

This particular embodiment of a method of decoding a series of binary digital signals has several advantages in terms of memory utilization, computational complexity and implementation. As previously suggested, the number of entries for the data structure depends on the maximum code length for the Huffman code, not the number of symbols. Therefore, this results in a reduction of memory. For example, when application with a fixed limit code length, such as GZIP, a typical Huffman tree has 285 symbols and the code length is limited to 15 bits. In contrast, the number of entries employing for this embodiment will have at most 15 entries, depending on the data, resulting, in this example in a 19×reduction in memory utilization.

Likewise, computational complexity is reduced by using a bit parallel search process, rather than a bit serial search process. Here, this embodiment is based, at least in part, on the code length information in the data structure. The search procedure improves over existing approaches by checking the range of the start and end codes for the group having that code length. Experimental results with this embodiment, which employ 19 symbols and a maximum code lengths of 7 bits, provide a 5.5 times reduction in complexity, compared with decoding in which a search of Huffman code table is employed. Likewise, because no binary tree construction takes place, as occurs where a Huffman tree is constructed, and with little or no dynamic memory allocation, implementation of decoding in accordance with the present invention is relatively easy in both hardware and software.

It will, of course, be understood that, although particular embodiments have just been described, the invention is not limited in scope to a particular embodiment or implementation. For example, one embodiment may be in hardware, whereas another embodiment may be in software. Likewise, an embodiment may be in firmware, or any combination of hardware, software, or firmware, for example. Likewise, although the invention is not limited in scope in this respect, one embodiment may comprise an article, such as a storage medium. Such a storage medium, such as, for example, a CD-ROM, or a disk, may have stored thereon instructions, which when executed by a system, such as a computer system or platform, or an imaging system, may result in an embodiment of a method in accordance with the present invention being executed, such as a method of performing Huffman decoding, for example, as previously described. Likewise, embodiments of a method of creating a data structure, in accordance with the present invention, may be executed.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A method of decoding a series of binary digital signals using a data structure, the series of binary digital signals being encoded, said method comprising:

searching the data structure based on, at least in part, the length of a subgrouping of binary digital signals of the series of binary digital signals being decoded; and, prior to searching, selecting the first N binary digital signals in the series as the subgrouping, N being the length of the longest code.

2. The method of claim 1, and further comprising:

decreasing the length of the subgrouping by the next binary digital signal in the series if no code in the data structure having length N matches the subgrouping.

3. The method of claim 1, wherein the binary digital signals are encoded in accordance with a Huffman code.

4. The method of claim 1, wherein the data structure is organized, at least in part, based on code length.

5. The method of claim 4, wherein every code in the data structure having the same length as the subgrouping is checked for a match.

6. The method of claim 5, wherein the data structure is organized in subgroupings of codes having the same code length, the subgroupings being stored sequentially.

7. An article comprising: a storage medium, said storage medium having stored thereon, instructions, that, when executed, result in a method of decoding a series of binary digital signals using a data structure being executed, the series of binary digital signals being encoded, by:

searching the data structure based on, at least in part, the length of a subgrouping of binary digital signals of the series of binary digital signals being decoded; and, prior to searching, selecting the first N binary digital signals in the series as the subgrouping, N being the length of the longest code.

8. The article of claim 7, wherein said instructions, when executed, result in the length of the subgrouping being increased by the next binary digital signal in the series if no code in the data structure having length N matches the subgrouping.

9. The article of claim 7, wherein the instructions, when executed, result in the binary digital signals being encoded in accordance with a Huffman code.

10. The article of claim 7, wherein the instructions, when executed, result in the data structure being organized, at least in part, based on code length.

* * * * *